US008993949B2

(12) United States Patent
Madore et al.

(10) Patent No.: US 8,993,949 B2
(45) Date of Patent: Mar. 31, 2015

(54) OPTICAL SENSOR ARRAY AND METHOD FOR SOLAR CONCENTRATOR ALIGNMENT

(75) Inventors: David Madore, Vancouver, WA (US); Leonard Lee, Vancouver, WA (US); Eric Martin, Vancouver, WA (US)

(73) Assignee: U.S. Digital Corporation, Vancouver, WA (US)

( * ) Notice: Subject to any disclaimer, the term of this patent is extended or adjusted under 35 U.S.C. 154(b) by 639 days.

(21) Appl. No.: 13/308,429

(22) Filed: Nov. 30, 2011

(65) Prior Publication Data

US 2013/0133640 A1 May 30, 2013

(51) Int. Cl.

| | |
|---|---|
| ***G01C 21/02*** | (2006.01) |
| ***G01C 21/24*** | (2006.01) |
| ***G01J 1/20*** | (2006.01) |
| ***F24J 2/14*** | (2006.01) |
| ***F24J 2/38*** | (2014.01) |
| ***G01S 3/786*** | (2006.01) |
| ***H01L 25/04*** | (2014.01) |
| ***H01L 31/02*** | (2006.01) |
| ***H01L 31/0203*** | (2014.01) |

(52) U.S. Cl.

CPC ............. *H01L 31/02019* (2013.01); *F24J 2/14* (2013.01); *F24J 2/38* (2013.01); *G01S 3/7861* (2013.01); *H01L 25/042* (2013.01); *H01L 31/02024* (2013.01); *H01L 31/0203* (2013.01); *Y02E 10/45* (2013.01); *Y02E 10/47* (2013.01)

USPC .... 250/203.4; 136/246; 359/642; 356/139.01

(58) Field of Classification Search

USPC .......................... 136/246, 251, 259; 359/642; 356/139.01; 126/569, 573; 250/203.1, 250/203.4, 203.6

See application file for complete search history.

(56) References Cited

U.S. PATENT DOCUMENTS

| | | | | |
|---|---|---|---|---|
| 3,996,460 | A | 12/1976 | Smith | |
| 4,297,572 | A | 10/1981 | Carlton | |
| 4,445,030 | A | 4/1984 | Carlton | |
| 5,255,666 | A * | 10/1993 | Curchod | 126/569 |
| 5,344,497 | A * | 9/1994 | Fraas et al. | 136/246 |
| 6,005,236 | A * | 12/1999 | Phelan et al. | 250/203.4 |
| 6,274,862 | B1 | 8/2001 | Rieger | |
| 7,432,488 | B1 | 10/2008 | Hines et al. | |
| 7,807,920 | B2 * | 10/2010 | Linke et al. | 136/246 |
| 2002/0179138 | A1 | 12/2002 | Lawheed | |
| 2004/0079863 | A1 | 4/2004 | Lasich | |
| 2007/0193620 | A1 * | 8/2007 | Hines et al. | 136/246 |
| 2008/0017784 | A1 | 1/2008 | Hoot et al. | |

* cited by examiner

*Primary Examiner* — Francis M Legasse, Jr.

(74) *Attorney, Agent, or Firm* — Marger Johnson & McCollom PC

(57) ABSTRACT

In a solar concentrator of a type having a curved mirror adapted to focus light onto an energy collecting body mounted at the mirror's focal axis, an alignment correction apparatus and method includes a linear array of light detectors adapted to be mounted at a bottom of and across a centerline of the curved mirror so as to intercept the shadow cast by the energy collecting body mounted along the focal axis. Outputs of each of the detectors are measured and plotted according to an order of arrangement of the light detectors on the array. The output results in a dip across adjacent detectors when a shadow falls across the array. A shadow detection means is adapted to determine a center point of the dip and correction means are configured to output a correction command if the center point is different from an optimal position.

16 Claims, 7 Drawing Sheets

OPTICAL SENSOR ARRAY AND METHOD FOR SOLAR CONCENTRATOR ALIGNMENT

FIELD OF THE INVENTION

This invention relates generally to solar energy collecting systems and more particularly photodetector arrays used to detect whether a solar concentrator is optimally oriented toward the sun.

BACKGROUND

Solar energy collection systems convert direct sunlight into thermal or electrical energy. Once such type of energy collection system is called a solar concentrator and uses curved mirrors to reflect and focus incident sunlight onto a solar converter such as a photocell or fluid pipe coupled to a heat exchanger.

Solar concentrators have an advantage over traditional flat solar panels in that fewer photocells are required to collect the energy. Whereas photocells are required over the entire surface of the solar panel, a concentrator only requires such photocells (or heat exchange system) at the focal point or axis of the concentrator mirror. While this reduces cost, it also imparts an inherent disadvantage within concentrator systems. That is, solar concentrators must be precisely oriented toward the sun in order to maintain a high efficiency of collection and this problem is compounded by the fact that the sun moves throughout the day.

Different solutions have been proposed for properly oriented the solar concentrator toward the sun. Some of these solutions—such as U.S. Pat. No. 3,996,460 (Smith), U.S. Pat. No. 6,274,862 (Rieger), U.S. Pat. No. 4,445,030 (Carlton), and U.S. Patent Application Publications 2004/0079863 (Lasich), 2008/0017784 (Hoot), and 2002/0179138 (Lawheed)—use light boxes, pinholes, shadow masks, shadow bars, and the like to detect off-axis orientation of the detectors relative to the sun. A drawback to these approaches is that, since the shadow-casting means in these references is part of the same structure as the detectors, a misalignment of the housing relative to the collector would cause an error when trying to align the mirror.

Accordingly, the need remains for an improved means for optimally orienting a solar concentrator toward the sun while avoiding the drawbacks of these prior systems.

SUMMARY OF THE INVENTION

The invention comprises using an array of sensors mounted across a centerline of a curved mirror to detect a shadow cast by an object mounted at the focal axis of the mirror and to align the mirror thereby.

In one aspect of the invention, disclosed is a photodetector apparatus for use with a solar concentrator of a type having a curved mirror adapted to focus light onto a solar energy collector mounted at a focal position. The solar energy collector is configured to cast a shadow along a central axis of the curved mirror when the mirror is at an optimum orientation with respect to the sun. The inventive apparatus comprises a first array of at least three light sensitive elements arranged successively one after another along a first linear direction, wherein each respective one of said elements has an output adapted to provide a respective output signal responsive to light impinging on said respective element. The first array is configured to be mounted across the central axis of the curved mirror so that the shadow cast from the solar energy collector falls across at least one of the light sensitive elements to create an energy profile across the first array. The energy profile includes a dip centered along the first array. This energy profile will be equivalent to an optimum energy profile when the mirror of the solar concentrator is optimally oriented with respect to the sun. A housing includes light diffusing means for diffusing light incident on a surface of the housing into an interior of the housing, with the first array received within the interior of the housing.

In another aspect of the invention, an alignment correction apparatus is disclosed for use with a solar concentrator of a type having a curved mirror adapted to focus light onto a focal axis. The apparatus comprises a linear array of light detectors adapted to be mounted at the bottom of and across a centerline of a curved mirror of a solar concentrator. Measurement means are coupled to outputs of each of the detectors for determining the measured output of the detectors and plotting the output according to an order of arrangement of the light detectors on the array. The output results in a dip across adjacent detectors when a shadow falls across the array. A shadow detection means is adapted to determine a center point of the dip and correction means are configured to output a correction command if the center point is different from an optimal position.

The disclosure also teaches an inventive method for correcting the alignment of a solar concentrator mirror of a type having a curved surface arranged about a linear centerline and adapted to focus solar energy to a focal axis spaced from the mirror. The method comprises mounting an array of detectors across the centerline of a solar concentrator mirror so that a shadow cast by an energy collecting body disposed along a focal axis of the mirror falls across at least a plurality of detectors in the array when the mirror is optimally aligned with the sun. Each of the detectors has an output adapted to provide a respective output signal responsive to light impinging on said respective detector. A detection dip is then measured across the outputs of the plurality of detectors responsive to the shadow and the position of the mirror corrected responsive to a location of the dip across the sensors.

The foregoing and other objects, features and advantages of the invention will become more readily apparent from the following detailed description of a preferred embodiment of the invention that proceeds with reference to the accompanying drawings.

DETAILED DESCRIPTION

Figure 1:
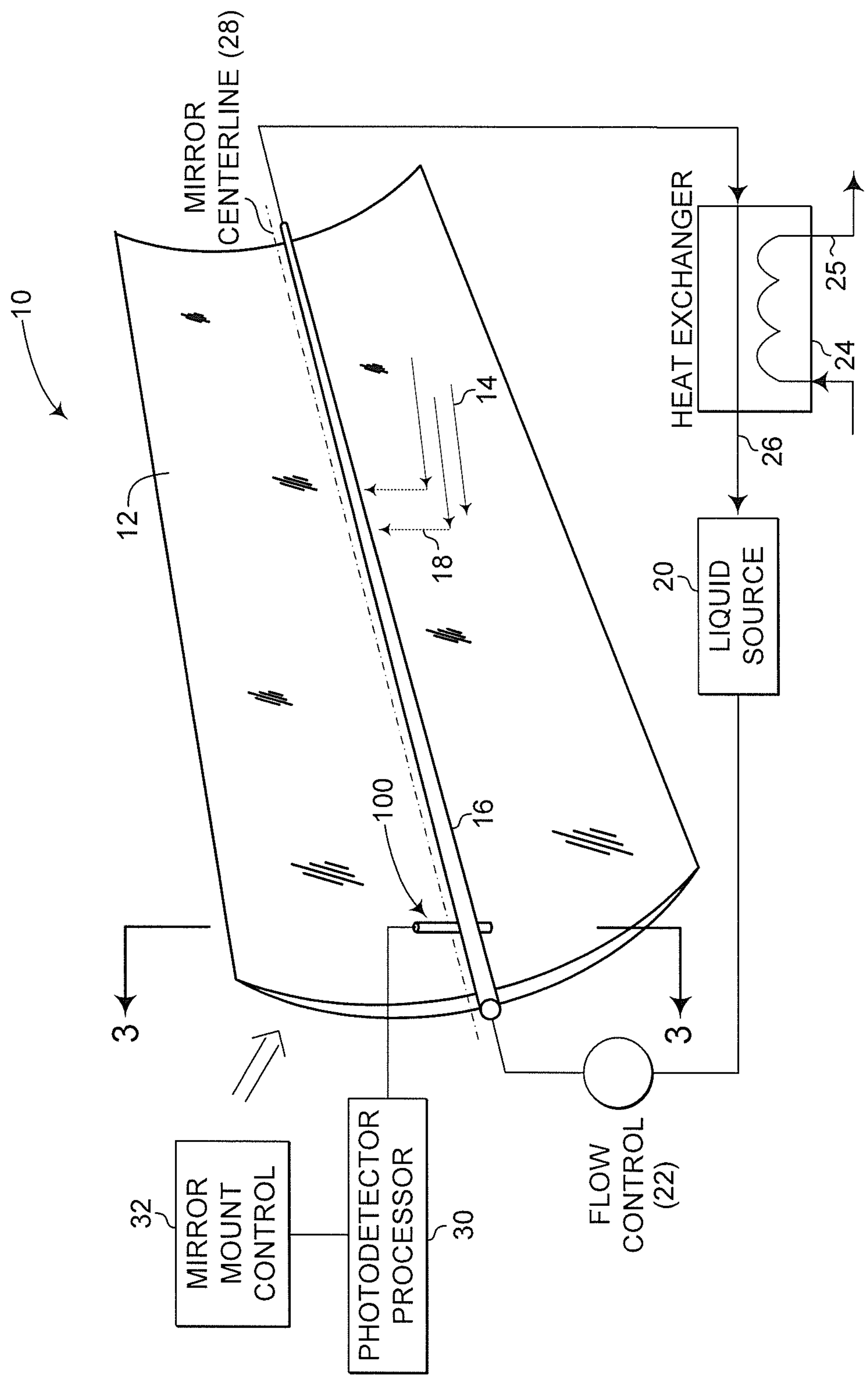
FIG. 1 is a perspective representation and schematic view showing a sensor array installed within a solar collector according to the invention.

FIG. 1 illustrates one example of a solar energy concentrator 10 that can be used with the inventive sensor array 100.

The type shown is one in which solar energy is transformed into thermal energy, although others methods may be used with the sensor array—e.g. conversion to electrical energy—and its use is in no way limited to the specific embodiment shown.

The solar concentrator 10 includes one or more curved mirrors, such as trough-shaped parabolic mirror 12, configured to receive incident sunlight 14 and reflect the sunlight onto a focal point or axis. In the example shown in FIG. 1, the trough-shaped parabolic mirror 12 reflects and thereby focuses incident sunlight 14 falling onto its surface to a focal axis. An energy collection tube 16 is disposed at the focal line of reflector 12 so that the rays of line focused, reflected sunlight 18 impinge directly in concentrated form upon the thermally conductive material, such as copper, from which the tube 16 is formed.

As the rays of reflected, line focused sunshine heat the tube 16, liquid is displaced from source 20 through the tube 16 at a flow rate controlled by flow control 22. The liquid so displaced is heated by the elevated temperature of the tube 16, typically to a very high temperature along the focal line, with the effluent hot water or steam being delivered, for example, to a heat exchanger 24, where the liquid or steam emerging from tube 16 is used to heat another segregated liquid, which is discharged from the heat exchanger as effluent from tube 25. The liquid entering the heat exchange 24 as influent is, after the heat exchanged process, discharged along tube 26, and is returned to the source 20.

To obtain maximum efficiency of the solar concentrator system 10, one must optimally align the focusing mirror 12 so that it points directly at the sun. In this optimal alignment, the energy collection tube 16 of the concentrator 10 is directly interposed between the sun and the central axis or linear mirror centerline 28 defined along the bottom of the trough of the mirror.

In this position, the tube 16 will cast a shadow along the mirror centerline 28. In a preferred embodiment of the invention, a sensor array 100 is mounted about the linear centerline 28 of the solar concentrator mirror 12 so that a shadow cast by the energy collecting body, such as tube 16, disposed along a focal axis of the mirror falls across at least a plurality of detectors in the array when the mirror is optimally aligned with the sun. As will be explained in more detail below, signal outputs from the sensor array are transmitted to a comparator, such as photodetector processor 30, and the mirror mount control 32 operated to correct the tilting direction of the mirror 12 if the mirror is found to be pointing in a sub-optimal direction.

Figure 2:
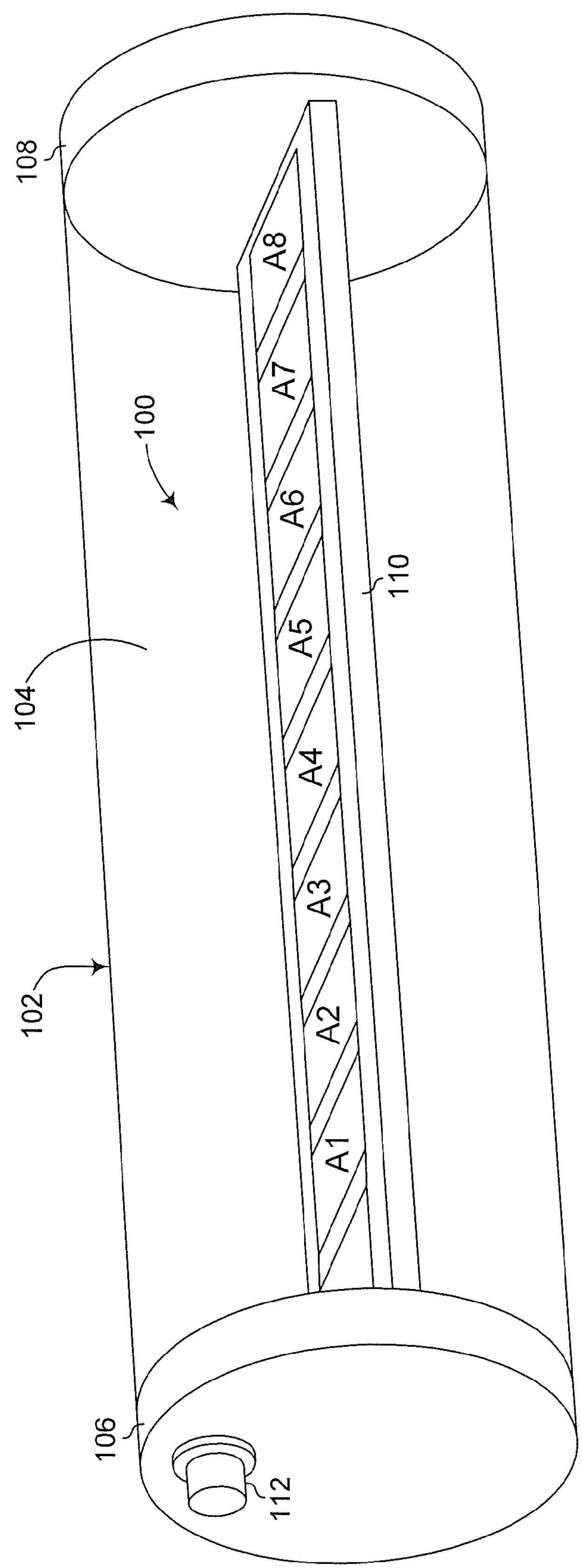
FIG. 2 is a perspective view of a sensor array housing and array configured according to the invention.

FIG. 2 shows one embodiment of the sensor array 100. The array 100 includes an elongate housing 102 formed in the shape of a cylindrical tube, and having cylindrical sidewalls 104 bounded and sealed on either end by end caps 106, 108. The housing is hollow, and has mounted within its interior a linear array of light sensitive elements, here comprised of sub-arrays A1 through A8, mounted on a circuit card 110. Although three light sensitive elements would be a minimum for proper operation of the sensor array, the array preferably includes at least eight light sensitive elements, and most preferably at least sixty-four light sensitive elements. Each of the sub-arrays, e.g. sub-array A1, can correspond to the circuit shown in FIG. 7 where each sub-array is equivalent to other sub-arrays within the sensor array 100 and all sub-arrays oriented in a linear fashion along circuit card 110.

In a preferred embodiment, the housing 102 includes light diffusing means to ensure that a uniform diffuse light hits the sensors. In one embodiment, the light diffusing means of the housing includes a translucent outer wall adapted to allow diffused light to enter into an interior of the housing. The translucent outer wall surface may be textured as by sandblasting to create a diffusing surface, or the outer wall may alternately be formed of a translucent colored material. Another type of diffusing means includes a transparent membrane interposed between the transparent housing outer wall 104 and the first array of light sensitive elements. Outputs from the sensor array are normalized, multiplexed, and communicated to the photodetector processor 30 via an interface, e.g. an RS485 or other serial interface 112.

Figure 3:
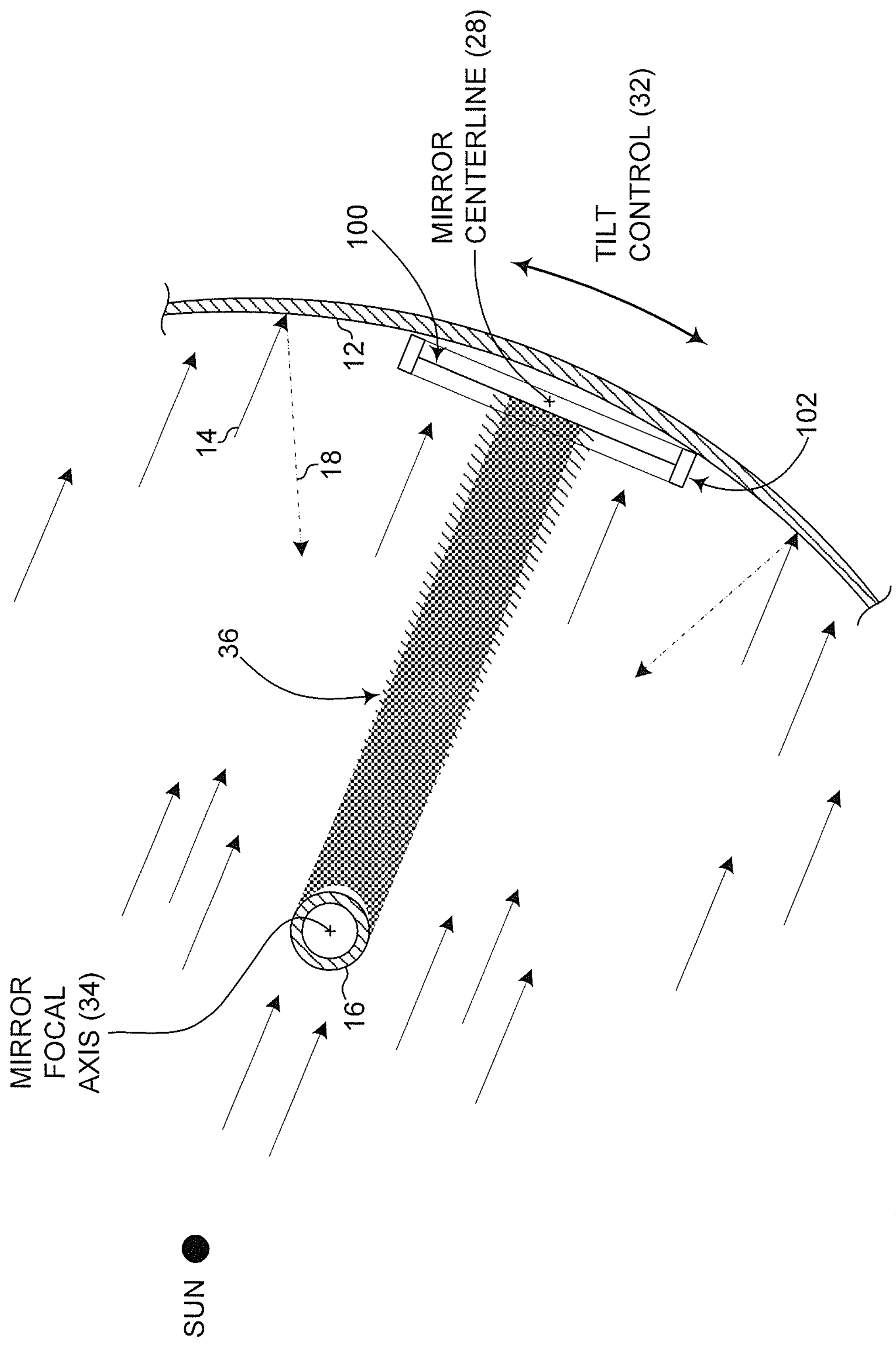
FIG. 3 is a section taken along line 3-3 of FIG. 1.

FIG. 3 shows a side elevation view of the detector array and housing 102 mounted on the curved mirror 12 of a solar collector according to teachings of the invention. The housing 102 can be supported by mounting brackets (not shown) at each end. The brackets can attach to the mirror with some sort of adhesive or bolts. But unlike prior art devices where precise mounting is required because the shadow-casting portion was part of the detector device, mounting error in the present system is minimized because such a system assumes that the pipe 16 is properly mounted at the focal axis of the mirror. During calibration, therefore, it may be determined that the shadow cast by the pipe 16 falls across different detectors than the most center ones. As will be explained further below, a drift in the center of the shadow would indicate that the mirror 12 is losing alignment with the sun.

In one embodiment comprising a linear array of sixty-four (64) detectors, each detector is spaced 0.2" apart and is mounted in the trough of a linear parabolic solar concentrator mirror so that detectors D32 (the last detector in sub-array A4) and D33 (the first detector in sub-array A5, adjacent to detector D32) are on either side of the mirror centerline 28. When the array is mounted within housing 102 substantially along a long axis of the housing and spaced from the cylindrical outer wall 104, the housing is arranged perpendicularly across the mirror centerline 28. The fluid-filled pipe 16 runs parallel to, but is spaced from, the mirror centerline 28, is mounted at the focal axis 34 of the mirror, and is heated by the concentrated solar rays 18 reflected from the mirror 12. The pipe 16 casts a thin shadow 36 onto the mirror that falls across the detector array 100. This shadow causes a dip in detected energy across several adjacent detectors. When the center of this dip is midway between detectors D32 and D33, then the mirror is properly aligned to the sun and at its optimum position. If the shadow centerline is not between detectors D32 and D33, then a signal is sent to a tilt control mechanism 32 coupled to the mirror mount and the position of the mirror is corrected until an optimum position is reached.

Figure 4A:
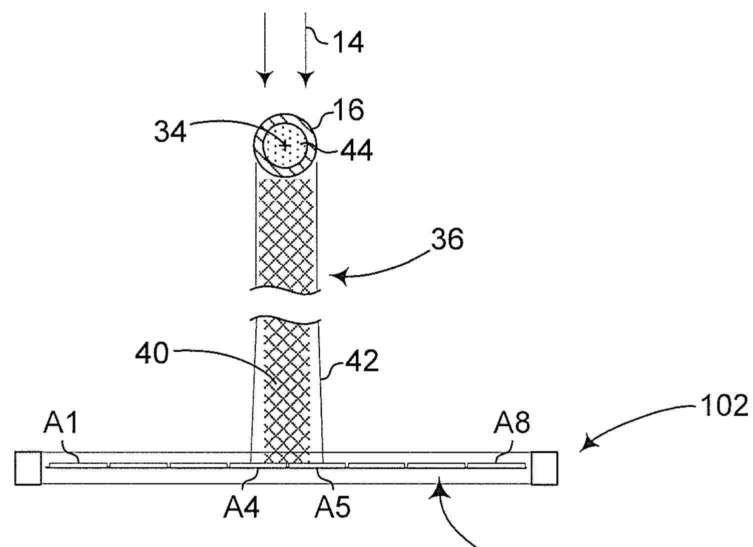
FIG. 4A is a side elevation showing the umbra and penumbra cast by a solar collection tube falling onto a portion of the sensor array of FIG. 1.
Figure 4B:
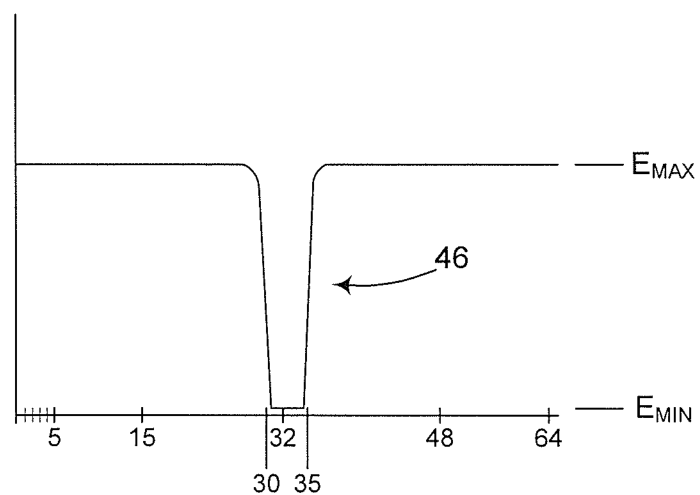
FIG. 4B is a graph showing the photodiode output of the sensor array from the shadow of FIG. 4A.

FIGS. 4A and 4B illustrate how the distribution of a shadow 36 on the sensor array 100 affects the signal outputs across each of the sensors on the array. In FIG. 4A, the shadow cast by pipe 16 comprises a fully-shadowed umbra portion 40 and a partially-shadowed penumbra portion 42. Because the sun is not a true point source, any shadow 36 cast by pipe 16 will have a main umbra portion 40 and a much smaller penumbra portion 42. Pipe 16 is filled with a working fluid 44 and is centered about a focal axis 34 of the curved mirror 12. Incident sunlight 14 is interrupted by the interposed pipe 18 and causes the shadow 36 to fall onto a central portion of the array housing 102, while unimpeded incident sunlight falls directly on the other portion of the housing 102. Because the array 100 is configured to be mounted across the central axis of the curved mirror, the shadow 36 falls across at least on of the light sensitive elements to create an energy profile (FIG. 4B) across the first array.

FIG. 4B illustrates the energy profile of the array 100 showing a dip 46 in the energy profile centered along array 100—e.g. between detectors D32 and D33—where the energy output signal drops from $E_{MAX}$ to $E_{MIN}$. This energy profile matches a predetermined optimum energy profile only when the mirror of the solar concentrator is optimally oriented with respect to the sun. That is, if the optimum energy profile requires that the center of energy dip 46 occur equally between detectors D32 and D33, then a measured detection dip having a determined center that differs from the optimum energy profile (e.g. centered on detector D32 alone) indicates that the mirror is not properly oriented. A signal is then sent to a motorized control to effect movement of the mirror 12 until the energy profile—and particularly the dip center—matches that of the predetermined optimum.

Figure 5A:
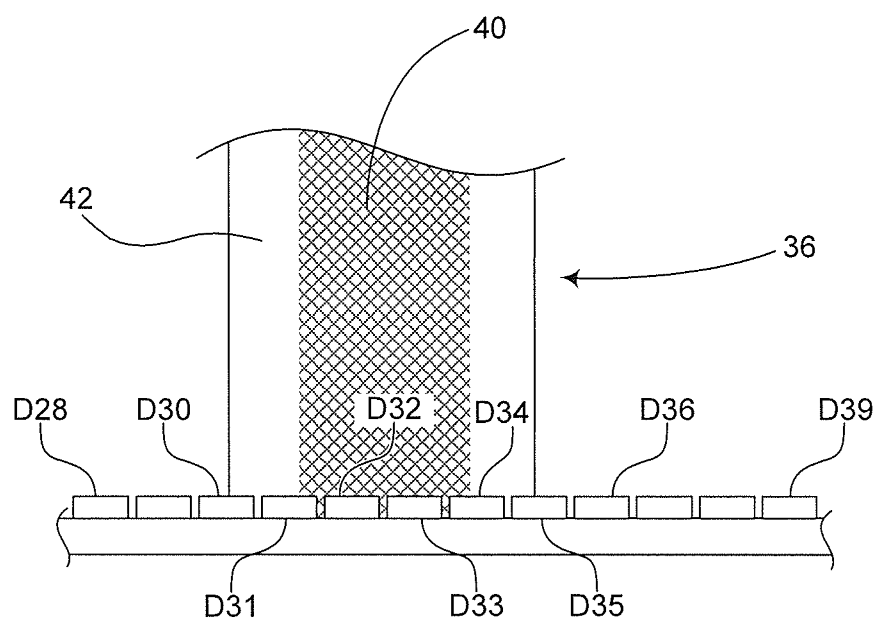
FIG. 5A is a magnified side elevation of FIG. 4A.
Figure 5B:
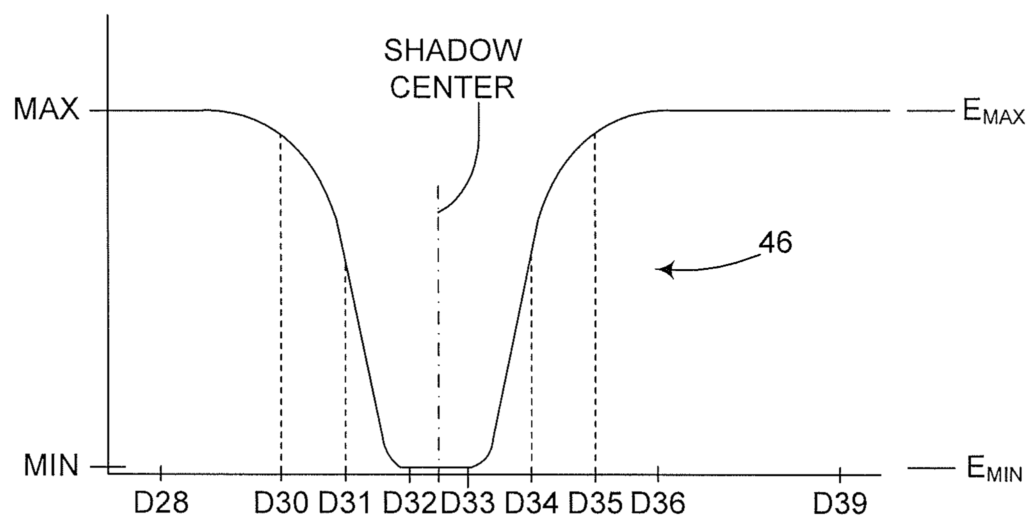
FIG. 5B is a magnified graph showing the photodiode output of the sensor array of FIG. 5A.

FIGS. 5A and 5B show a magnified view of the incident light pattern and resulting energy profile from FIGS. 4A and 4B. Whereas the total number of detectors included in the sample array 100 is sixty-four, only a subset of this array is shown—detectors D28 through D39. A shadow 36 falls onto the center ones of these detectors so that the umbra 40 falls fully on detectors D32 and D33, and partially on detectors D31 and D34. The penumbra extends this shadow profile out to partially cover detectors D30 and D35. The width of the penumbra is increased in the drawings shown for clarity, although it is understood that the penumbra 42 would normally be much narrower than the umbra 40. A full shadow blocks most of the incident light falling onto detectors D32 and D33, thus dropping the output signal from $E_{MAX}$ to $E_{MIN}$. Where the detector—e.g. detectors D31 and D34—are partially in the umbra and partially in the penumbra, the output signal registers just above $E_{MIN}$. And where the detector—e.g. detectors D30 and D35—are partially in the penumbra and partially in unshaded, the output signal registers just below $E_{MAX}$. And where the detector—e.g. detectors D28 and D39—are completely unshaded, the output signal registers at $E_{MAX}$. The resulting energy profile has a lope on the falling and rising edges of the dip in the sensor readings. And given enough granularity, that is enough sensors, the edges of the dip will be symmetric about the dip in the readings so the calculation of the center point will not be affected. An algorithm can be used to detect the boundaries of the dip in the readings, do a curve fit, and then calculate the center of the dip from the curve parameters.

In use, the photodetector processor 30 (FIG. 1) is connected to outputs of the light sensitive elements D1 through D64 of sensor array 100 to receive the output signals, and from these signals determine a different between the detected energy profile 46 and an optimum energy profile. Measurement means are coupled to outputs of each of the detectors for determining a measured output of the detectors and plotting the output according to an order of arrangement of the light detectors in the array. The output, as shown in FIG. 5, shows a dip across adjacent detectors when a shadow from the energy collecting body mounted at the focal axis of the mirror falls across the array. Interpolation may be used with shadow detection means to find the center location of the shadow to a resolution better than one detector spacing. Correction means such as a mirror mount control 32 (FIG. 1) receives this difference between the energy profile and optimum energy profile, and from this difference issue a mirror control correction command signal until the energy profile (e.g. the location of the dip center) from the array substantially matches that of the optimum energy profile.

Figure 6:
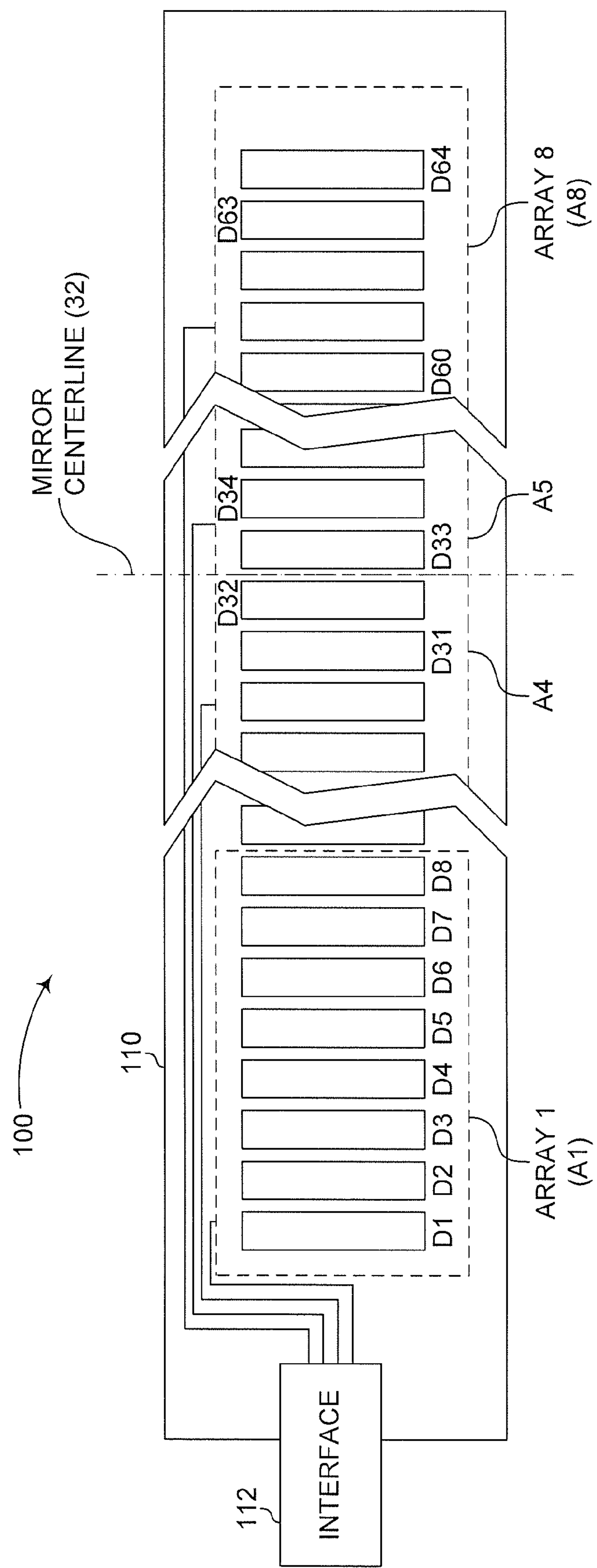
FIG. 6 is a plan view schematic showing the sensor array motherboard configured according to the present invention.

FIG. 6 is a plan view showing a linear arrangement of light sensitive elements in an array 100 along a circuit card 110. Array 100 includes, in a preferred embodiment sixty-four light sensitive elements D1 through D64 arranged in a line along a long axis of the array housing and perpendicular to the mirror centerline 28. In one embodiment, the light sensitive elements are arranged in a plurality of sub-arrays A1 through A8, with each sub-array including eight light sensitive elements. However, it is understood that the invention is not limited to such an arrangement and that there is no boundary for the number of light sensitive elements that may be used, whether they are arranged in co-axial sub-arrays, or whether such elements are in a single array.

Figure 7:
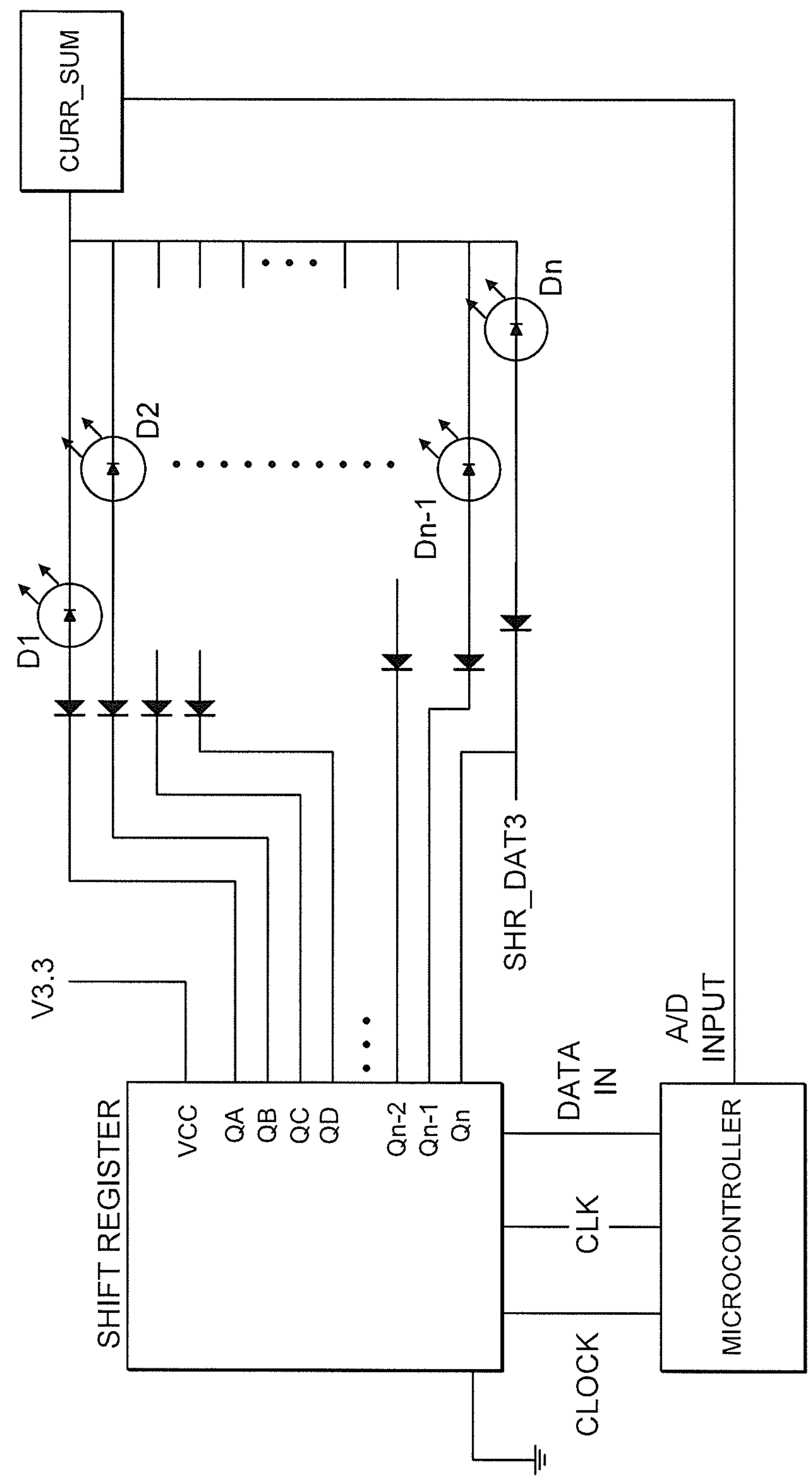
FIG. 7 is a schematic of a group of sensor circuits embodied within the array of FIG. 6.

FIG. 7 is an exemplary sensor array and processing circuitry for use with the invention. The number of light sensitive elements in the circuit is unbounded, and is shown schematically as n such circuits. In the exemplary embodiment described above, where sixty-four such circuits are used and grouped in eight, 8-bit circuits (where n=8), these 8-bit shift registers feature AND-gated serial inputs and an asynchronous clear (CLR) input. The gated serial (A and B) inputs permit complete control over incoming data; a low at either input inhibits entry of the new data and resets the first flip-flop to the low level at the next clock (CLK) pulse. A high-level input enables the other input, which then determines the state of the first flip-flop. Data at the serial inputs can be changed while CLK is high or low, provided the minimum setup time requirements are met. Clocking occurs on the low-to-high-level transition of CLK.

The sensor array 100 is a sensing device that can help determine if the mirror is pointed properly. It consists of a linear array of light detectors with an amplifier, A/D converter, multiplexing circuitry, microcontroller and an RS485 or other serial interface. The LEDs are coupled to the shift register via low leakage diodes. An embodiment uses 64 detectors spaced 0.2" to 0.25" inches apart. LEDs are used in reverse to sense the light level—an arrangement that significantly lowers costs since LED's are relatively inexpensive. Processing is done in the microcontroller to lower noise and ensure that each detector's output is uniform across the array. The mechanical housing 102 encases the circuitry and protects it from the environment while ensuring that a uniform, diffuse light hits the detectors. The mirror motion control system can read the light levels from the detectors as digital numbers over the serial interface. The sensor can also calculate the pipe position and report a single value back to the host. This information can help the host determine if the mirror is tilted at the correct angle.

One advantage the present invention has over the prior art is that the sensor array housing is not required to be mounted exactly perpendicular to the shadow 36 cast by the fluid pipe 16. Whereas misaligning the shadow box (e.g. Carlton '030) would cause the ray of light falling through opening to be cast on a non-central photo detector, misalignment of the present invention sensors would simply reduce the total light each sensor receives proportionally and thereby not affect a reading of the center of the dip. But while the present invention need not be mounted at an exact angle relative to the mirror and fluid pipe, care needs to be taken to determine which point along the sensor array falls along the true center axis of the mirror so that the device may be properly calibrated. That is, a calibration point would need to be set when the solar concentrator mirror is in its optimal position with respect to the sun. The calibration point results in a reference dip and a reference dip center across the array of detectors. The center of the detection dip is then calculated and the calculated center is compared with the calibration dip center. A variance results in a correction command being issued to correct a position of the mirror responsive to a location of the dip across the sensors.

Having described and illustrated the principles of the invention in a preferred embodiment thereof, it should be apparent that the invention can be modified in arrangement and detail without departing from such principles. We claim all modifications and variation coming within the spirit and scope of the following claims.

We claim:

1. A photodetector apparatus for use with a solar concentrator of a type having a curved mirror adapted to focus light onto a solar energy collector mounted at a focal position wherein the solar energy collector casts a shadow along a central axis of the curved mirror when the mirror is at an optimum orientation with respect to the sun, the apparatus comprising:

a first array of at least three light sensitive elements arranged successively one after another along a first linear direction, wherein each respective one of said elements has an output adapted to provide a respective output signal responsive to light impinging on said respective element;

the first array configured to be mounted across the central axis of the curved mirror so that the shadow cast from the solar energy collector falls across at least one of the light sensitive elements to create an energy profile across the first array including a dip in the energy profile centered along the first array, the energy profile being an optimum energy profile when the mirror of the solar concentrator is optimally oriented with respect to the sun; and a housing having light diffusing means for diffusing light incident on a surface of the housing into an interior of the housing, the first array received within the interior of the housing.

2. The photodetector apparatus of claim 1, further including a comparator connected to said outputs of said light sensitive elements to receive said output signals, and from said output signals determine a difference between said energy profile and an optimum energy profile.

3. The photodetector apparatus of claim 1, wherein the light diffusing means of the housing includes a translucent outer wall adapted to allow diffused light to enter into an interior of the housing.

4. The photodetector apparatus of claim 1, wherein the light diffusing means of the housing includes a transparent wall and a translucent body interposed between the housing transparent wall and first array.

5. The photodetector apparatus of claim 1, wherein housing includes a cylindrical outer wall, the first array mounted within the interior of the housing substantially along a long axis of the housing and spaced from the cylindrical outer wall.

6. The photodetector apparatus of claim 1, wherein the first array includes at least eight light sensitive elements.

7. The photodetector apparatus of claim 2, further including a mirror control connected to said comparator to receive said difference between said energy profile and an optimum energy profile, and from said difference issue a mirror control signal until the energy profile output from the first array substantially matches that of the optimum energy profile.

8. The photodetector apparatus of claim 6, wherein the first array includes at least 64 light sensitive elements.

9. A photodetector apparatus for use with a solar concentrator of a type having a curved mirror adapted to focus light onto a solar energy collector mounted at a focal position wherein the solar energy collector casts a shadow along a central axis of the curved mirror when the mirror is at an optimum orientation with respect to the sun, the apparatus comprising:

a first array of at least three light sensitive elements arranged successively one after another along a first linear direction, wherein each respective one of said elements has an output adapted to provide a respective output signal responsive to light impinging on said respective element;

the first array configured to be mounted across the central axis of the curved mirror so that the shadow cast from the solar energy collector falls across at least one of the light sensitive elements to create an energy profile across the first array including a dip in an output signal of at least one of the light sensitive elements wherein the output signal of at least two of the light sensitive elements in the array are different from one another, the energy profile being an optimum energy profile when the mirror of the solar concentrator is optimally oriented with respect to the sun; and a housing having light diffusing means for diffusing light incident on a surface of the housing into an interior of the housing, the first array received within the interior of the housing.

10. The photodetector apparatus of claim 9, further including a comparator connected to said outputs of said light sensitive elements to receive said output signals, and from said output signals determine a difference between said energy profile and an optimum energy profile.

11. The photodetector apparatus of claim 9, wherein the light diffusing means of the housing includes a translucent outer wall adapted to allow diffused light to enter into an interior of the housing.

12. The photodetector apparatus of claim 9, wherein the light diffusing means of the housing includes a transparent wall and a translucent body interposed between the housing transparent wall and first array.

13. The photodetector apparatus of claim 9, wherein housing includes a cylindrical outer wall, the first array mounted within the interior of the housing substantially along a long axis of the housing and spaced from the cylindrical outer wall.

14. The photodetector apparatus of claim 9, wherein the first array includes at least eight light sensitive elements.

15. The photodetector apparatus of claim 10, further including a mirror control connected to said comparator to receive said different between said energy profile and an optimum energy profile, and from said difference issue a mirror control signal until the energy profile output from the first array substantially matches that of the optimum energy profile.

16. The photodetector apparatus of claim 14, wherein the first array includes at least 64 light sensitive elements.

* * * * *